US006656575B2

(12) United States Patent
Bijkerk et al.

(10) Patent No.: US 6,656,575 B2
(45) Date of Patent: Dec. 2, 2003

(54) MULTILAYER SYSTEM WITH PROTECTING LAYER SYSTEM AND PRODUCTION METHOD

(75) Inventors: Frederik Bijkerk, Amsterdam (NL); Eric Louis, Ijsselstein (NL); Andrey E. Yakshin, Nieuwegein (NL); Peter Cornelis Görts, Utrecht (NL); Sebastian Oestreich, Rijswijk (NL)

(73) Assignee: Carl-Zeiss-Stiftung, Heidenheim (DE)

( * ) Notice: Subject to any disclaimer, the term of this patent is extended or adjusted under 35 U.S.C. 154(b) by 58 days.

(21) Appl. No.: 09/821,448

(22) Filed: Mar. 29, 2001

(65) Prior Publication Data

US 2002/0012797 A1 Jan. 31, 2002

(30) Foreign Application Priority Data

Mar. 31, 2000 (DE) .......................................... 100 16 008

(51) Int. Cl.$^7$ ................................................. B32B 9/00
(52) U.S. Cl. ..................... 428/212; 428/408; 428/469; 428/472; 428/698; 428/701; 428/44
(58) Field of Search ................................ 428/212, 408, 428/698, 472, 469, 701

(56) References Cited

U.S. PATENT DOCUMENTS

| 5,052,033 A | * | 9/1991 | Ikeda et al. |
| 5,265,143 A | * | 11/1993 | Early et al. |
| 5,310,603 A | | 5/1994 | Fukuda et al. |
| 5,433,988 A | | 7/1995 | Fukuda et al. |
| 5,760,981 A | | 6/1998 | Gillich |
| 5,958,605 A | * | 9/1999 | Montcalm et al. |
| 6,160,867 A | * | 12/2000 | Murakami |

FOREIGN PATENT DOCUMENTS

| EP | 1 065 568 A2 | | 1/2001 |
| JP | 06273596 | * | 9/1994 |
| JP | 08122496 | * | 5/1996 |
| WO | WO 99/24851 | | 5/1999 |

OTHER PUBLICATIONS

J.H. Underwood et al., *Tarnishing of Mo/Si multilayer x–ray mirrors*, Applied Optics, vol. 32, 1993, p. 6985–6990.

C. Montcalm et al., *Multilayer reflective coatings for extreme–ultraviolet lithography*, SPIE, vol. 3331, p. 42–51.

M. Cilia et al., *Ni/Si based multilayer for the reflection of soft x rays in the "water window"*, J. Appl–Phys., 82 (9), 1997, p. 4137–4142.

Jitendra S. Goela, et al., Applied Optics, Properties of chemical–vapor–deposited silicon carbide for optics applications in severe environments, vol. 30, No. 22, Aug. 1, 1991, p. 3166–3175.

* cited by examiner

*Primary Examiner*—Archene Turner
(74) *Attorney, Agent, or Firm*—Hudak, Shunk & Farine Co. LPA

(57) ABSTRACT

Multilayer systems, such as those used as mirrors in the extreme ultraviolet wavelength range, suffer contamination or oxidation during storage in air and in long-time operation, i.e. when exposed to EUV radiation in a vacuum environment with certain partial pressures of water or oxygen, which causes a serious reduction in reflectivity. The multilayer system according to the invention will have a long life with constantly high reflectivity. The multilayer systems according to the invention have protective layers made from ruthenium, aluminium oxide, silicon carbide, molybdenum carbide, carbon, titanium nitride or titanium dioxide. The multilayer systems according to the invention are produced by direct, ion-beam-supported growth of the protective layer or, except in the case of ruthenium, by mixing aluminium or titanium with oxygen or nitrogen at atomic level, with ion-beam support, to product an outermost protective layer with ion-beam support. The multilayer systems according to the invention are not only resistant to contamination and oxidation, but can also be cleaned if necessary, without losing reflectivity. Because of their long life with constantly high reflectivity, they are particularly suitable for use in semiconductor lithography in the soft X-ray range or extreme ultraviolet wavelength range.

3 Claims, No Drawings

MULTILAYER SYSTEM WITH PROTECTING LAYER SYSTEM AND PRODUCTION METHOD

FIELD OF THE INVENTION

The invention relates to multilayer reflective systems with a protective capping layer system according to the claims. The invention also relates to the production method of such multilayer systems.

BACKGROUND OF THE INVENTION

Conventional multilayer systems are produced by depositing materials with different reactive indices or different absorption coefficients on top of each other in several layers on a substrate. They are used in particular as mirrors in the extreme ultraviolet range. The wavelength range between 10 nm and 50 nm is designated as the extreme ultraviolet wavelength range. Other possible applications of multilayer systems are for example, in the visible wavelength range, as antireflective coatings of optical elements.

The reflection of electromagnetic radiation on a multilayer system is based on interference between the radiation which is reflected on the many interfaces of the multilayer system and is approximated by Bragg's law. This reflection is thus of a dispersive nature. The reflectivity of the interface between two such layers for electromagnetic radiation in a wavelength range <50 nm amounts to a few per thousand for angles that are greater than the critical angle. For reflection angles greater than the critical angle reflectivities up to a magnitude of 70% can be obtained. Multilayer systems are therefore used to achieve high reflectivities with maximum angles relative to the layer surface, and can also be used as dispersive elements.

A multilayer system for reflecting short wavelengths consists of successive sets of two or more layers respectively of materials with different refractive indices and thicknesses, for example in the magnitude of the wavelength of the reflected radiation. Partial reflection takes place at each of the interfaces between the different materials, and with a proper choice of the individual layer thicknesses, all partial reflections add up coherently. The overall reflectivity of a multilayer system is determined by the magnitude of the reflection per boundary surface, i.e. the difference of the refractive indices.

Multilayer systems for the extreme ultraviolet wavelength range generally consist of molybdenum-silicon- or molybdenum-beryllium-systems. For special applications multilayer systems are used made up from more than two differing types of layers. The choice of material with all multilayer systems depends heavily on the application's wavelength range.

Multilayer systems are utilized for the extreme ultraviolet to soft x-ray wavelength range amongst other things in lithography for the production of semiconductor components. It is precisely in their being employed in lithography that the multilayer system needs to demonstrate a long life with maximum possible constant reflectivity. On the one hand, the mirrors must show as little radiation damage as possible despite long periods of radiation. Any contamination or radiation damage would result in a shortened lifetime and usage interval, and hence in increased cost of the lithography process. The reflectivity does not fluctuate, but would go down monotonously.

Examinations have shown (J. H. Underwood et al., Applied Optics, Vol.32, 1993, p. 6985–6990), that when kept in air reflectivity decreases with time. Molybdenum silicon multilayer mirrors were examined. In particular, molybdenum used as the outermost layer became completely oxidized to molybdenum trioxide and molybdenum dioxide and contaminated with carbon-containing compounds, so that the absolute reflectivity decreased by 10 to 12%. The oxidization of the silicon layer into silicon dioxide caused a decrease in reflectivity of 4 to 5%.

In order to counter this, in U.S. Pat. No. 5,310,603 it is proposed that the mirrors should be provided with a protective layer of carbon of a thickness of 0.5 to 1 nm. With such mirrors we are dealing with a multilayer system for the soft x-ray range to the extreme ultraviolet wavelength range. For layering materials here use is made of, for example, ruthenium and silicon dioxide or even silicon carbide and hafnium.

In addition, C. Montcalm et al, SPIE Vol.3331, p.42–51 have a critical look at the problem of reduction of reflectivity by oxidization and contamination of the uppermost layer (p.44). Theoretical simulations were carried out for protective layers made from silicon dioxide, boron carbide, boron nitride, carbon, palladium, molybdenum carbide and molybdenum boride.

Moreover, C. Montcalm et al. tested experimentally and specifically for the first time how the reflectivity of multilayer systems changes when used in the context of lithography with extreme ultraviolet wavelengths. Measurements were carried out over a long period in real working conditions. In the course of this it was discovered that reflectivity is greatly decreased by contamination of the multilayer systems through residual substances in a vacuum.

WO 99/24851 describes a two or more layer passivation for multilayer reflectors for the soft x-ray and extreme ultraviolet wavelength range. The passivation consists at least of an under coating and an upper coating. In the case of the under coating it is a matter of the less absorbent material of the multilayer reflector, i.e. silicon in the case of molybdenum silicon mirrors, and beryllium in the case of molybdenum beryllium mirrors. In the case of the upper coating it is a matter of a material that does not oxidize or form an oxidation barrier and protects the layers beneath from oxidization. Quite generally these can be pure elements, carbides, oxides or nitrides. For example, silicon carbide, silicon dioxide or even molybdenum carbide are especially proposed. The thicknesses of the protective layers vary within the range 0.5 to 5 nm and are especially optimized on the mirrors to be protected. The upper coating is applied by precipitation from the gas phase or even controlled oxidization, the process for controlled oxidization not being elaborated in greater detail.

SUMMARY OF THE INVENTION

The present invention has as its task to prepare multilayer systems, especially for the extreme ultraviolet wavelength range, with a longer life span with as constant reflectivity as possible. This task is met by a multilayer system according to the claims. Moreover, the task is met by a process for the production of multilayer systems according to the claimed invention.

DETAILED DESCRIPTION OF THE INVENTION

The multilayer system according to the invention can consist of two or more materials with differing refractive indices or absorption coefficients. By applying a protective layer system from at least one of the substances ruthenium, aluminium oxide, titanium nitride, carbon, molybdenum carbide, silicon carbide or titanium dioxide respectively a situation is achieved where not only are the mirrors passivated against radiation damage, and chemical and mechanical influences, but the reflectivity is also even increased to a small extent. In contrast with conventional multilayer systems without a protective layer, the life span is increased e.g. by a factor of three.

The multilayer systems according to the invention have the advantage that they can be cleaned, without suffering any losses in reflectivity. Here various options for cleaning methods may be employed, whether it be for example ozone cleaning or wet or dry chemical etching.

Moreover, the multilayer system according to the invention shows the positive characteristic, compared with the multilayer systems of the prior art, of increased insensitivity to the partial pressure of water and/or water containing components, which are to be found during use of the multilayer system in a vacuum chamber. This results in the risk from oxidation by water being lessened.

The most important advantage of the multilayer system according to the invention is an improved resistivity against oxidation and contamination.

Ruthenium is an inert material which is resistant to surface deterioration caused, for example, by oxidation. In optical applications it has hitherto been used as a layer with a small refractive index in multilayer systems. In particular for synchrotron radiation, multilayer systems made from ruthenium and, for example, silicon oxide are used, as the thermal load is especially great with synchrotron radiation, which can damage other multilayer systems more rapidly. In addition, ruthenium is also used as a chemically inert interface between the substrate and the actual multilayer system.

Aluminium oxide, also known as alumina, occurs in various modified forms. Aluminium oxide in the form of corundum is used on account of its hardness as bearing stones in clocks or electrical measuring instruments as well as an abrasive for gemstones and metals. Ceramic substances are produced from aluminium oxide. Other applications are adsorbents in adsorption chromatography and also catalysts.

Titanium nitride serves as the main material for the production of hardening and anti-wear protective surface coatings on precision machine bearings, roller bearings, cutting tools and the like, for lining reaction containers, especially for liquid metals such as aluminium, copper and iron and for the coating of clock housings and jewellery. Thin coatings of titanium nitride can be created, for example, by gas phase precipitation.

Titanium dioxide is distinguished by a very high refractive index. It has a particular technical significance as an excellent white pigment. Titanium dioxide white pigments are used for whitening or brightening of colourful pigments. In chemistry, titanium dioxide also serves as a medium for catalysts.

Carbon is known to possess suitable properties as one of the materials in multilayer systems in the sense that it grows as an amorphous, dense layer with low chemical reactivity. In addition, it has suitable optical properties in the EUV and x-ray wavelength range.

All the coating materials have in common that they are used to passivate the surface of the multilayer system.

In some preferred embodiments only the protective layers of the multilayer system are made up respectively of ruthenium, aluminium oxide, titanium nitride, carbon, silicon carbide, molybdenum carbide or titanium dioxide.

In a preferred embodiment the protective layer system consists of carbon covered by ruthenium, silicon carbide covered by ruthenium, molybdenum carbide covered by ruthenium, aluminium oxide covered by ruthenium, titanium nitride covered by ruthenium, or titanium dioxide covered by ruthenium.

For special applications it can however be an advantage if there is added to the protective coating along with aluminium oxide, titanium nitride, titanium dioxide, silicon carbide, molybdenum carbide, carbon or ruthenium, a further substance, which can form not only a mixture but also an alloy or a compound with the ruthenium, aluminium oxide, titanium nitride, silicon carbide, molybdenum carbide, carbon or titanium dioxide.

The method for the production of a multilayer system for the extreme ultraviolet wavelength range, made from alternating layers of materials with different refractive indices or absorption coefficients with a protective layer system, consisting of one or several layers, is characterized in that they are applied directly to the outermost layer of the multilayer system and that some or all are produced with ion beam support during their fabrication.

Multilayer systems for the extreme ultraviolet range can be produced by applying a protective layer consisting of at least ruthenium, at least aluminium oxide, at least titanium nitride, at least silicon carbide, at least molybdenum carbide, at least titanium dioxide or at least carbon directly onto the outer layer of the multilayer system by ion beam during deposition of one or all of the uppermost layers (ion-beam assisted deposition, IBAD). The already known protective layer of silicon carbide can also be produced by this method with good results.

Ion irradiation during thin film growth is an effective means of controlling the structure and the composition of the thin film.

The use of one or more inert gases for the ion beam has proved especially successful. An ion beam containing Ar, Kr, oxygen, carbon or nitrogen is preferred.

In a preferred embodiment, to form the protective layer, carbon is introduced into a silicon or molybdenum layer, or oxygen into an aluminium or titanium layer, or nitrogen into a titanium layer, wherein the layer is polished with a carbon-, oxygen-, or nitrogen-containing ion beam. The silicon layer can be the topmost layer in the multilayer system. Methane ions can for example be used for a carbon-containing ion beam. On the one hand, carbon, oxygen or nitrogen are incorporated into the silicon, molybdenum, titanium or aluminium layer, so that an interface made from $SiC$, $Al_2O_3$, $Mo_2C$, $TiO_2$ or $TiN$ is formed. On the other hand the surface of the outermost layer is smoothened by the energy input.

Another preferred possible method for producing a multilayer system with a protective layer of at least aluminium oxide, titanium dioxide, titanium nitride or silicon carbide, consists of applying to the topmost layer of the multilayer system a thin layer of the metal of atomic thickness. Then the metal is oxidized or nitridized or carbonized, i.e. converted to a state of e.g. aluminium oxide or titanium nitride or silicon carbide, by applying low-energy oxygen or nitrogen or carbon ions. The formation of these chemical compounds can take place during or just after the growth of the single metal films.

Depending on how the ion beam is chosen or whether, in addition to the carbon, oxygen or nitrogen, layers of further substances are also applied, either a pure silicon carbide, aluminium oxide, molybdenum carbide, titanium dioxide or titanium nitride layer is formed, or a silicon carbide-, molybdenum carbide-, aluminium oxide-, titanium dioxide- or titanium nitride-containing protective layer.

One advantage that emerges generally from the treatment of the protective layer with ion beams is that the surface roughness is diminished, which increases the reflectivity of the multilayer system. The most important influence, however, is an improvement of the environmentally protective properties of the layer, due to the layer densification and the improvement of the layer morphology. By this means to a certain extent the refraction index can be influenced. Further particulars on the treatment of the surface with ion beams are to be found, for example, in M. Cilia et al., J. Appl.-Phys. 82 (9), 1997, p. 4137–4142.

The thickness of the protective layer can equally be adjusted by the surface treatment by means of an ion beam.

It has proved to be of advantage for the ion beam to use either one or several inert gases or ion beams which contain Ar, Kr, oxygen or nitrogen. In the latter case, the protective layer can be produced by first of all applying aluminium or titanium and there forming a corresponding protective layer of aluminium dioxide, titanium nitride or titanium dioxide through a deposit with input of oxygen or nitrogen from the ion beam.

In a preferred embodiment after deposition the protective carbon layer is exposed at least to EUV radiation, to electron beam, or to elevated temperatures.

In a preferred embodiment the exposures are done in the environment of gases containing oxygen.

The advantages of the invention are made clear by the following examples and comparative examples.

EXAMPLE 1

101 layers, with a thickness of 2.6 nm or 4 nm, of molybdenum and silicon respectively, are vapour-deposited onto a silicon substrate. The topmost layer is a silicon layer. A 1.5 nm-thick carbon layer is vapour-deposited on top of this. With an krypton ion beam, at the same time the carbon and the silicon layer at its interface are mixed to form a 1 nm-thick silicon carbide layer, and at the same time the surplus carbon is removed, and the silicon carbide surface polished to a roughness of less than 0.25 nm. With a wavelength of 13.2 nm, the reflectivity amounts to 70% both after production and also 200 days later when kept in air.

EXAMPLE 2

101 layers, with a thickness of 2.6 nm or 4 nm, of molybdenum and silicon respectively, are vapour-deposited onto a silicon substrate. The topmost layer is a silicon layer. A 1.5 nm-thick aluminium oxide layer is vapour-deposited on top of this. With an krypton ion beam, at the same time the protective layer on its surface is polished to a roughness of less than 0.25 nm. With a wavelength of 13.2 nm, the reflectivity amounts to 70% both after production and also 200 days later when kept in air.

EXAMPLE 3

101 layers, with a thickness of 2.6 nm or 4 nm, of molybdenum and silicon respectively, are vapour-deposited onto a silicon substrate. The topmost layer is a silicon layer. Supported by a nitrogen ion beam, titanium is vapour-deposited onto this, so that a 1.2 nm-thick titanium nitride layer is formed. With the ion beam, at the same time the protective layer on its surface is polished to a roughness of less than 0.25 nm. With a wavelength of 12.9 nm, the reflectivity amounts to 68% both after production and also 200 days later when kept in air.

EXAMPLE 4

101 layers, with a thickness of 2.6 nm or 4 nm, of molybdenum and silicon respectively, are vapour-deposited onto a silicon substrate. The topmost layer is a silicon or molybdenum layer. Supported by an ion beam, a 1 nm-thick ruthenium layer is applied onto this. The energy input of the ion beam leads to a densification of the ruthenium layer and a smoothing of the surface of the ruthenium layer to a roughness of less than 0.25 nm. With a wavelength of 13.0 nm, the reflectivity amounts to 69.5% after exposure to EUV radiation in a vacuum environment for several hours.

EXAMPLE 5

A total of 101 layers of molybdenum and silicon of respectively 2.6 and 4 nm, were deposited onto a silicon substrate. The topmost layer is a silicon layer. Then, a thin, 2 nm thick carbon layer is deposited under simultaneous use of an ion beam applied to the layer being grown. The energy provided by the ion beam leads to a dense and closed carbon layer of a favourable atomic structure, that makes it resistant to oxidation in an oxygen or water containing environment, e.g. at a partial pressure of $10^{-6}$ mbar. For a wavelength of 13.5 nm, the reflectivity amounts 68.0%, both just after production of the multilayer system, as well as after exposure of the multilayer system to EUV radiation on a vacuum environment with certain partial pressures of water or oxygen. The carbon layer, when produced with the additional use of an ion beam during growth, has made the multilayer system resistant against degradation or contamination under EUV exposure.

EXAMPLE 6

The multilayer system of example 5 ist kept in a vacuum environment with a controlled background pressure of oxygen during exposure to EUV radiation. The reflectivity of the multilayer system does not degrade during exposure suggesting a balancing of contamination and in-situ cleaning processes.

EXAMPLE 7

A total of 101 layer of molybdenum and silicon of respectively 2.6 and 4 nm were deposited onto a silicon substrate. The topmost layer is a silicon layer. Then, a thin, 2 nm thick carbon layer is deposited under simultaneous use of an ion beam grown. After that the surface is exposed to EUV radiation of 13.5 nm for several hours in vacuum with partial pressure of water at $10^{-6}$ mbar and partial pressure of oxygen of $10^{-4}$ mbar. Oxygen will diffuse in the carbon and silicon layers, react with these resulting in a passivation layer which is resistant to further oxidation under EUV radiation in an oxygen containing environment. For a wavelength of 13.5 nm, the reflectivity amounts to 68% after production of the multilayer system and may reduce or increase about 0.5% after the exposure to EUV after which it will stay constant under EUV radiation and when kept in air.

EXAMPLE 8

A total of 101 layer of molybdenum and silicon of respectively 2.6 and 4 nm were deposited onto a silicon substrate. The topmost layer is a silicon or molybdenum layer. Then two protective layers are deposited starting with a 2 nm carbon layer followed by 2 nm ruthenium layer. The carbon and ruthenium layers are deposited under simultaneous use of an ion beam. For a wavelength of 13.5 nm, the reflectivity amounts to 70% after production of the multilayer system and stays constant when kept in air and may change less than 0.5% (increases or decreases) under EUV radiation.

COMPARATIVE EXAMPLE

A molybdenum-silicon mirror made from 50 layer pairs consisting of 2.6 nm of Mo and 4 nm of Si and molybdenum as the outermost layer, immediately after production, before it comes into contact with air, has a reflectivity of 69% and after exposure to EUV radiation in a vacuum environment for several hours, a reflectivity of 55% with a wavelength of 13 nm in each case.

What is claimed is:

1. A multilayer system for the extreme ultraviolet wavelength range comprising:

alternating layers of materials with different refractive indices or absorption coefficients, and a protective layer system having different material than said alternating layers and being disposed on top of said alternating layers, wherein the protective layer system is ruthenium, aluminium oxide, titanium nitride, titanium dioxide, carbon covered by ruthenium, molybdenum carbide covered by ruthenium, aluminium oxide covered by ruthenium, titanium nitride covered by ruthenium, or titanium dioxide covered by ruthenium.

2. A multilayer system for the extreme ultraviolet wavelength range comprising:

alternating layers of materials with different refractive indices or absorption coefficients, and a protective layer system having different material than said alternating layers and being disposed on top of said alternating layers, wherein the protective layer system is a mixture, an alloy or a compound of ruthenium, aluminium oxide, titanium nitride or titanium dioxide, and a further substance.

3. A multilayer system for the extreme ultraviolet wavelength range comprising:

alternating layers of a) molybdenum and silicon or b) molybdenum and beryllium, and a protective layer system disposed on said alternating layers, wherein the protective layer system is ruthenium; aluminum oxide; titanium nitride or titanium dioxide; carbon covered by ruthenium; molybdenum carbide covered by ruthenium; aluminum oxide covered by ruthenium; titanium nitride covered by ruthenium; titanium dioxide covered by ruthenium; a mixture, an alloy or a compound of ruthenium and a further substance; a mixture, an alloy or a compound of aluminum oxide and a further substance; a mixture, an alloy or a compound of titanium nitride and a further substance; or a mixture, an alloy or a compound of titanium dioxide and a further substance.

* * * * *